(12) United States Patent
Pei

(10) Patent No.: US 8,714,392 B2
(45) Date of Patent: May 6, 2014

(54) LID FOR USE IN ION BEAM ASSISTED DEPOSITION

(75) Inventor: Shao-Kai Pei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 63 days.

(21) Appl. No.: 13/420,552

(22) Filed: Mar. 14, 2012

(65) Prior Publication Data

US 2013/0180987 A1 Jul. 18, 2013

(30) Foreign Application Priority Data

Jan. 12, 2012 (TW) .............................. 11101304 A

(51) Int. Cl.
*B65D 51/00* (2006.01)
*B65D 25/28* (2006.01)
*B65D 6/40* (2006.01)

(52) U.S. Cl.
USPC .......................... 220/212; 220/212.5; 220/748

(58) Field of Classification Search
USPC .............. 220/212, 212.5, 369, 373, 374, 731, 220/748, 756
See application file for complete search history.

(56) References Cited

U.S. PATENT DOCUMENTS

2011/0309049 A1* 12/2011 Papasouliotis et al. ......... 216/37

* cited by examiner

*Primary Examiner* — Anthony Stashick
*Assistant Examiner* — Madison L Poos
(74) *Attorney, Agent, or Firm* — Novak Druce Connolly Bove + Quigg LLP

(57) ABSTRACT

A lid includes a first surface defining a cavity, a first joint defining an inlet, a second joint defining an outlet, a center hole communicating with the inlet, a circular channel communicating with the outlet and extending along a periphery of the first surface, and a number of branch channels radially extending from the center hole to the circular channel. The first surface includes a screen plate retained within the cavity, capable of letting the side-effect particles adhere thereon. Each of the plurality of branch channels communicates with the center hole and the circular channel, allowing liquid of a predetermined temperature to circulate within the lid.

5 Claims, 4 Drawing Sheets

LID FOR USE IN ION BEAM ASSISTED DEPOSITION

BACKGROUND

1. Technical Field

The present disclosure relates to a lid for covering an opening of a container used in ion beam assisted deposition.

2. Description of Related Art

In ion assisted deposition (IAD) process, a container is needed to accommodate an evaporation source. The evaporation source should be melted before use. A lid is usually needed to block side-effect particles emitted by the evaporation source during the melting process. Though conventional lids can satisfy basic requirements, a new type of lid for covering the container is still needed.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure are now described in detail, with reference to the accompanying drawings.

Figure 1:
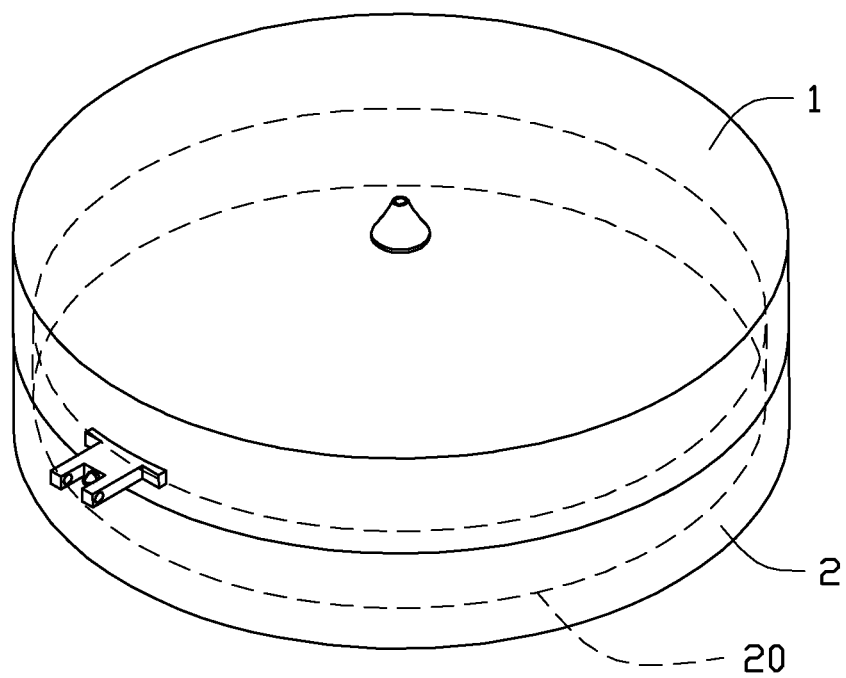
FIG. 1 is a schematic view of a lid according to an exemplary embodiment for covering a container.

Referring to FIG. 1, a lid 1 for use in an ion-beam assisted deposition (IAD) process according to an exemplary embodiment is illustrated. The lid 1 is used for covering a container 2 that defines an opening 20 for receiving an evaporation source, and the lid 1 is detachably connected to the container 2 for covering the opening 20. During an ion-beam assisted deposition (IAD) process, the evaporation source is first heated by a device such as an electron gun and melted and then cooled to provide a planar smooth surface. During the process, the lid 1 is closed and side-effect particles emitted by the evaporation source are deposited on the lid 1.

Figure 2:
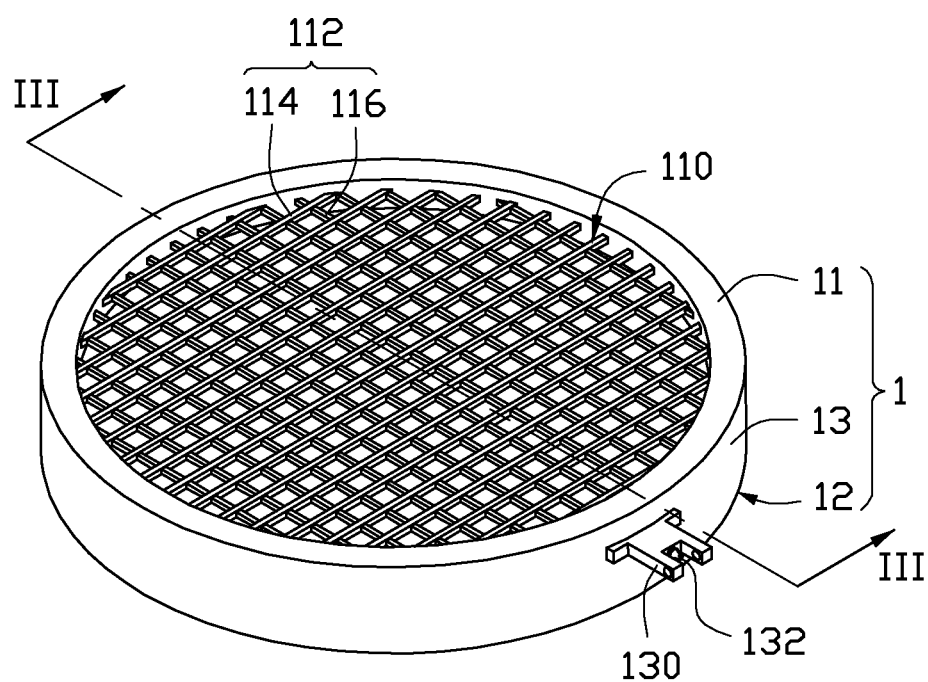
FIG. 2 is a schematic view of the lid of FIG. 1.
Figure 3:
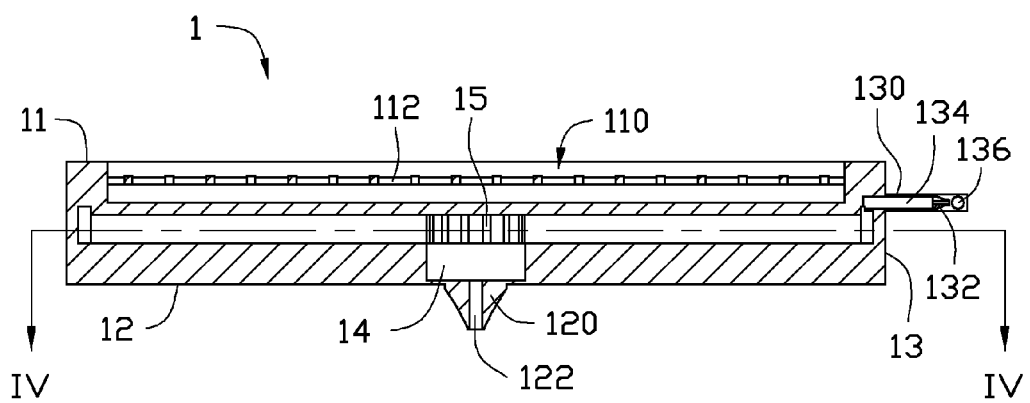
FIG. 3 is a cross-sectional view of the lid, along line III-III of FIG. 2.

Referring also to FIGS. 2-3, the lid 1 includes a first surface 11, a second surface 12 opposite the first surface 11, and a lateral surface 13 between the first surface 11 and the second surface 12. The first surface 11 defines a cavity 110 and receives a screen plate 112 in the cavity 110. The screen plate 112 includes a number of first bars 114 and second bars 116 perpendicularly intersecting with each other, which forms a number of holes. The second surface 12 includes a first joint 120 that defines an inlet 122 running therethrough. The lateral surface 13 includes a handle 130 protruding therefrom and a second joint 132 defining an outlet 134 therethrough. The handle 130 includes two parallel arms 136 perpendicular to the lateral surface 13, and the second joint 132 is located between the two arms 136.

Figure 4:
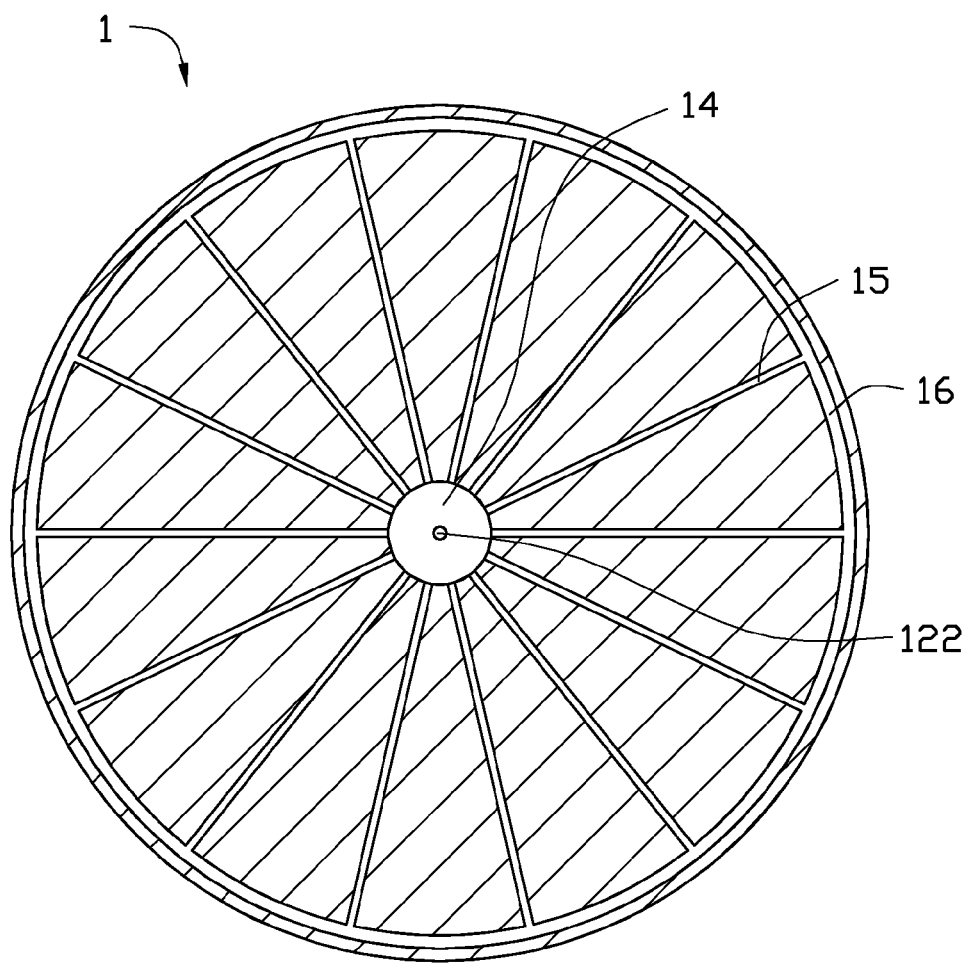
FIG. 4 is a cross-sectional view of the lid, along line IV-IV of FIG. 3.

Referring also to FIG. 4, the lid 1 further defines a center hole 14 communicating with the inlet 122, a circular channel 16 communicating with the outlet 134, and a number of branch channels 15 radially extending from the center hole 14 to the circular channel 16. Liquid of a predetermined temperature can enter into the center hole 14 from the inlet 122, flow through the branch channels 15 to the circular channel 16, and finally exit from the outlet 134, thereby allowing heat to be transferred from the flowing liquid to the lid 1. As a result, the temperature of the lid 1 can be maintained within a predetermined range.

In use, the screen plate 112 has the advantage of letting the side-effect particles adhere thereon, and the lid 1 of which the temperature is maintained within a predetermined range can prevent the side-effect particles from disengaging from the screen plate 112. As a result, the side-effect particles cannot fall into the container 2 and contamination of the evaporation source can be avoided.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. A lid comprising:
    a first surface defining a cavity and comprising a screen plate retained within the cavity, the screen plate being capable of letting side-effect particles adhere thereon;
    a first joint defining an inlet, wherein a center hole is defined in the lid and communicates with the inlet;
    a second joint defining an outlet;
    a circular channel communicating with the outlet and extending along a periphery of the first surface; and
    a plurality of branch channels radially extending from the center hole to the circular channel, allowing liquid of a predetermined temperature to circulate within the lid.

2. The lid as described in claim 1, wherein the screen plate comprises a plurality of first bars and second bars perpendicularly intersecting with each other, which forms a number of holes.

3. The lid as described in claim 1, further comprising a second surface opposite the first surface, wherein the first joint is formed on the second surface.

4. The lid as described in claim 2, further comprising a lateral surface between the first surface and the second surface, and the lateral surface comprising a handle protruding therefrom.

5. The lid as described in claim 4, wherein the handle comprises two parallel arms perpendicular to the lateral surface, and the second joint is located between the two arms.

* * * * *